United States Patent [19]

Shin et al.

[11] Patent Number: 5,257,220

[45] Date of Patent: Oct. 26, 1993

[54] DIGITAL DATA MEMORY UNIT AND MEMORY UNIT ARRAY

[75] Inventors: Yong-Chul Shin, Amherst; Ramalingam Sridhar, East Amherst; Victor Demjanenko, North Tonawanda; Paul W. Palumbo, East Amherst; Sargur N. Srihari, Williamsville, all of N.Y.

[73] Assignee: Research Foundation of the State Univ. of N.Y., Buffalo, N.Y.

[21] Appl. No.: 850,644

[22] Filed: Mar. 13, 1992

[51] Int. Cl.[5] .............................................. G11C 15/00
[52] U.S. Cl. ....................................... 365/49; 365/162; 365/189.07; 365/195; 365/203; 365/233
[58] Field of Search ............... 365/49, 168, 189.07, 365/195, 233, 203

[56] References Cited

U.S. PATENT DOCUMENTS

| | | | |
|---|---|---|---|
| 4,780,845 | 10/1988 | Threewit | 365/49 |
| 4,928,260 | 5/1990 | Chuang | 365/49 |
| 5,036,486 | 7/1991 | Noguchi et al. | 365/49 |

Primary Examiner—Joseph E. Clawson, Jr.
Attorney, Agent, or Firm—M. LuKacher

[57] ABSTRACT

A digital data memory unit and memory unit array, each unit of which can be searched in accordance with the contents thereof and updated, utilizes a digital storage element in the form of a register, latch, or memory cell, a comparator and control logic. Data is presented to the units in parallel on data lines and compare data is supplied in parallel to the units along other data lines. Parallel search of data in each unit, with multiple updates in units where the stored data matches the compare data, occurs rapidly and in one clock cycle (e.g., approximately 50 nanoseconds). The control logic responds to a match output from the comparator and an update enable pulse to enable a new data word on the data lines to be written into the digital storage element of the unit. The memory unit array is useful in image processing for storing pixel values and searching and updating these values in the process of image analysis to recognize certain images.

11 Claims, 3 Drawing Sheets

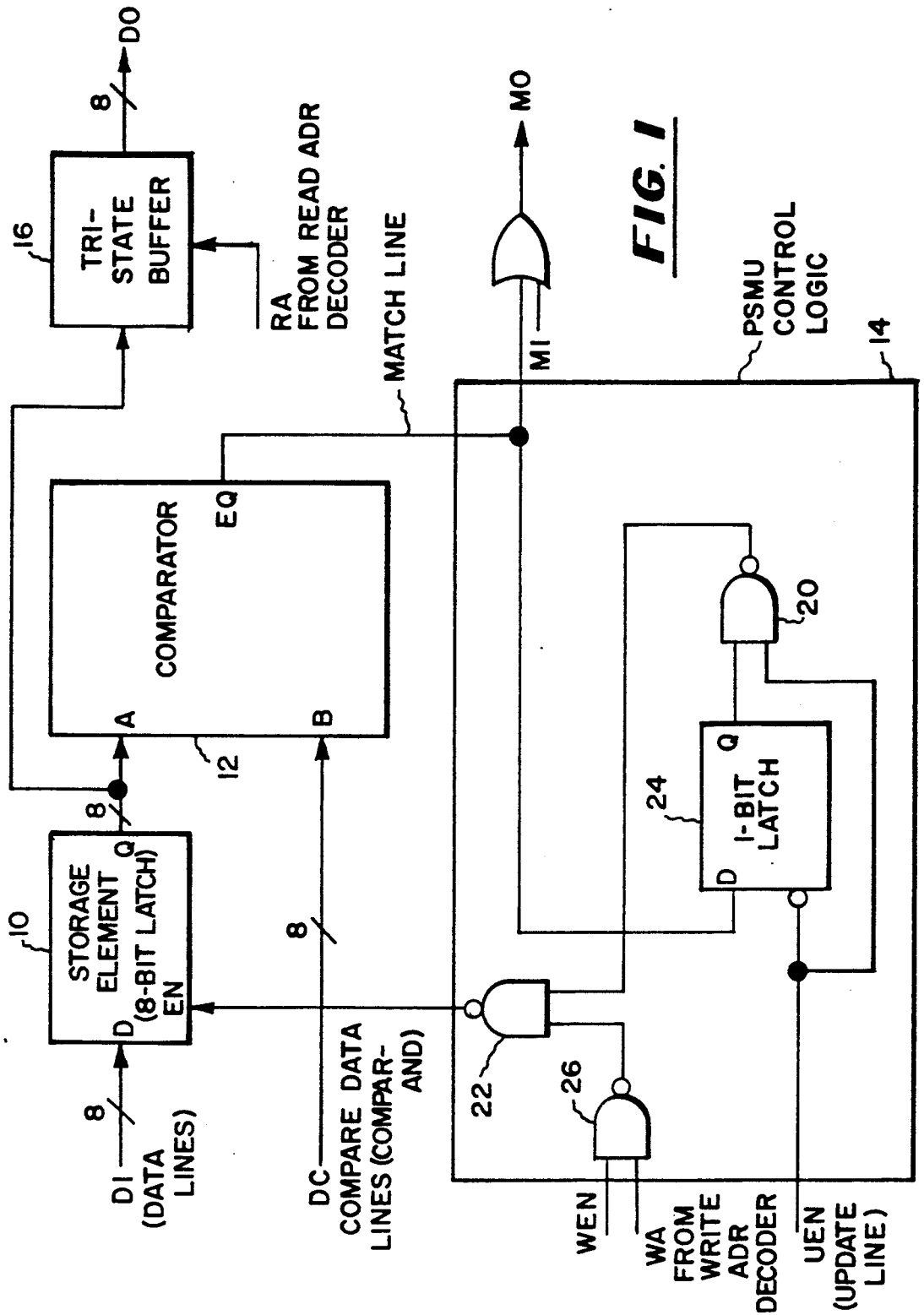

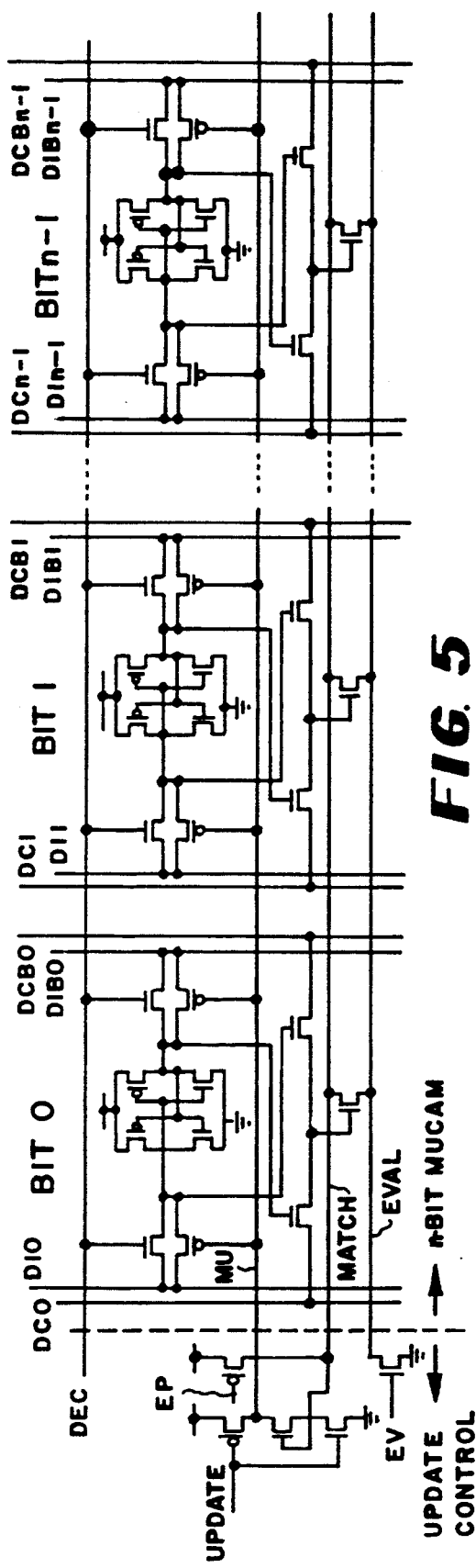
FIG. 5
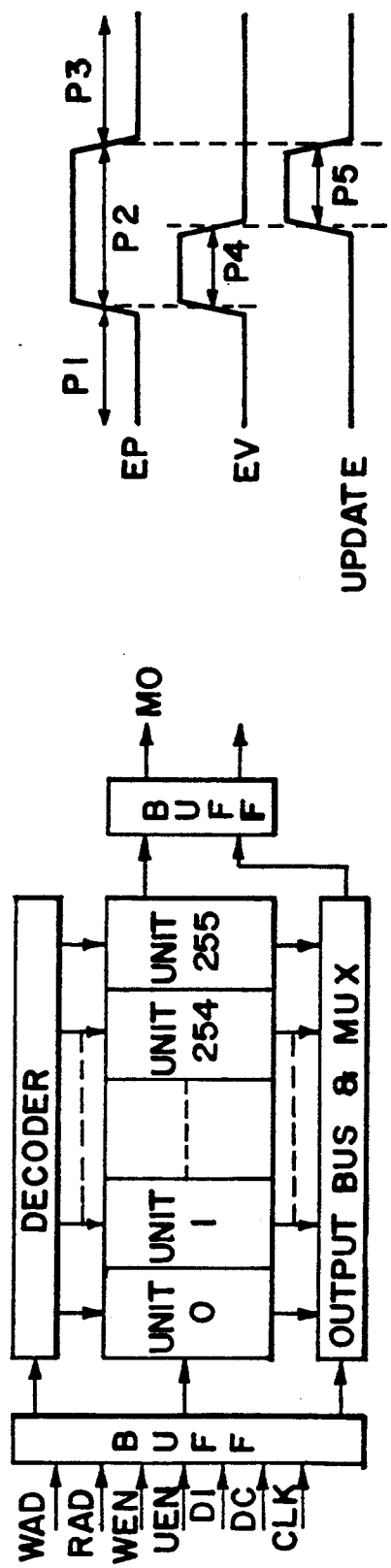
FIG. 4
FIG. 2

DIGITAL DATA MEMORY UNIT AND MEMORY UNIT ARRAY

The present invention relates to digital data memories and particularly to a digital data memory unit and a memory unit array including a multiplicity of such units. More particularly the invention relates to a memory unit array which is especially suitable for real time image processing whereby data representing the pixels of an image may be stored in different units of the array in a manner to permit parallel searches and multiple updates of data in different units, which operation is referred to as PSMU (parallel searches and multiple updates) herein.

The invention is especially suitable for use in image processing applications in that it requires a memory array which may be addressed to store data in each unit thereof and to provide updates in accordance with the content of (the data stored in) each unit. An array in accordance with the invention may be called a multiple update content addressable memory (MUCAM) in that it has the capability to read, write or perform parallel searches and multiple updates of the data in up to all of the units thereof in parallel, and in a single clock cycle, thereby providing a fast updatable array. In image processing applications, using connected component analysis wherein kernels of pixel representative data are assigned like values in the process of analysis, the MUCAM enables the data representing the kernels to be searched for and updated in parallel and rapidly in a single clock cycle.

Content addressable memories of the type that are presently available (see Threewitt U.S. Pat. No. 4,780,845, dated Oct. 25, 1988 and Chuang et al., U.S. Pat. No. 4,928,260 dated May 22, 1990) are capable of searching a multiplicity of units simultaneously in accordance with the content thereof. Such memories are not capable of satisfying requirements for fast updating with new data. Also they generally handle one selectable unit per unit array and do not provide the capacity needed for image processing applications.

Accordingly, it is the principal object of the present invention to provide a fast updatable memory unit and an array of such units, which are content addressable for updating with new data.

It is a further object of the present invention to provide a multiple update content addressable memory (MUCAM) which has the capability to read, write or perform Parallel searches and multiple updates to a multiplicity of locations and in extremely short periods of time such as a clock cycle, and for example a clock cycle of the order of 50 nanoseconds.

It is a still further object of the present invention to provide an improved memory and particularly a MUCAM which can be implemented as an integrated circuit chip with the use of commercially available CMOS technology.

Briefly described, a content controlled updatable memory unit which is updatable during an update pulse cycle and which may be part of an array including a multiplicity of such units which are identical with each other, has a digital storage element, such as a register, latch, or memory cell capable of storing a multibit dataword. The storing element is updated to store a second dataword when the word already stored therein matches with a third dataword or comparand which is presented to a comparator with the word stored in the element before it is updated. Control means responsive to an update enable pulse which changes state during the pulse cycle (which may be a clock pulse cycle), enables the element to be updated when a match occurs. The control logic may utilize a digital storage element which effectively prevents updating except during the enable pulse and even though new data is presented on data lines connected to the storage element or the comparator. The units may be arranged in an array in matrix format so as to share common input and output buses and receive write and read enable signals in response to read and write address data for selectively reading and writing datawords to the digital storage elements (registers, latches or memory cells) of selected ones of the units.

The foregoing and other objects, features and advantages of the invention, as well as a presently preferred embodiment thereof, will become more apparent from a reading of the following description in connection with the accompanying drawings into which:

FIG. 1 is a schematic diagram of a content controlled, updatable data memory unit embodying the invention;

FIG. 2 is a functional block diagram of a MUCAM in accordance with the invention;

FIG. 4 is a timing diagram of control signals EP, EV an UPDATE which provide the function of the UPDATE enable pulse UEN; and FIG. 5 is a circuit diagram of a multibit MUCAM unit.

Figure 3:
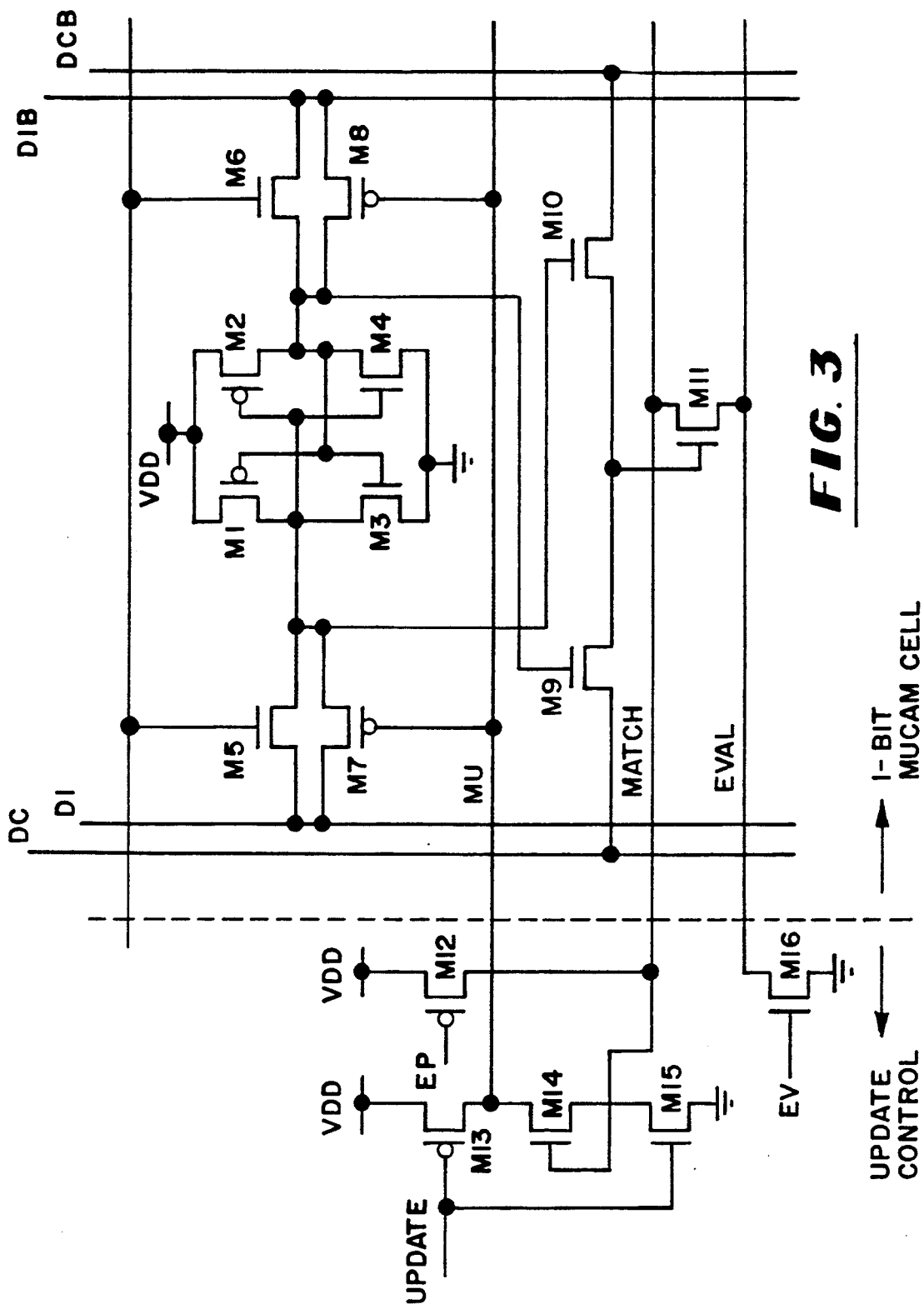
FIG. 3 is a circuit diagram of a 1 bit MUCAM cell using field effect transistors.

The MUCAM of the presently preferred embodiment of the invention which is shown in the drawings has 256 identical units each of a design shown in FIG. 1. These units include digital storage elements in the form of 8 bit latches, registers or memory cells 10 and are addressable by compare data DC on compare data lines, or comparand lines, connected to a comparator 12. The contents of the digital storage element 10 appears on the Q outputs thereof, and is applied to a first set of input lines A of the comparator, while the compare data lines go to the other input B. When implemented in a chip, the digital storage elements may be contained in a $256 \times 8$ bit register array and the comparator in a $256 \times 8$ bit comparator array.

The comparators generate match outputs each on a respective match line dedicated to its unit. The parallel search and multiple update function (PMSU) is controlled in each unit by its control logic 14. The control logic also controls writing of data DI into the digital storage element 10, when the unit is addressed by a write address WA and on occurrence of a write enable pulse WEN.

As shown in FIG. 2, the WAD, RAD, WEN, UEN, DI, DC and system CLK lines are buffered and applied to the units. Write and read addresses WAD and RAD are decoded to select the units to which data is to be written and from which data is to be read. These write and read addresses are decoded in a decoder to obtain the WA and RA signals which address a particular unit.

The RA signal enables a tristate buffer 16 which transfer the data at the Q outputs of the element 10 to the data output line (DO) of the array. All inputs and outputs are buffered.

The match line from the EQ output of the comparator 12 is ORed with other match inputs MI from other units in the array to provide a match output (MO) in the event that a match is detected in any of the units of the array. Match Output of one unit is connected to Match Input at an adjacent unit in an array of units.

Another input to each unit is the update line UEN which is connected to the control logic 14 of each unit, and on which, an update pulse appears during an update pulse cycle, which may be equal in duration to a clock cycle (for example of 52 nanoseconds total.) Upon occurrence of the update pulse and also on occurrence of an output on the match line from the comparator the update pulse is effectively applied through NAND gates 20 and 22 to the enable input EN of the latch 10. The logic 14 assures that, except during the UEN pulse, or WEN pulse as discussed supra. new data cannot be written to the digital storage element 10. Thus, the data (a first dataword) in the digital storage element which represents the content of the unit, remains available for comparison with the comparand word on the compare data line and is not updated except when the UEN pulse occurs. A one bit flip flop or latch 24 stores the match output during occurrence of the UEN pulse.

The control logic 14 also includes another NAND gate 26 to which the decoded address WA and the write enabled WEN pulsed is applied when the unit is addressed for writing data to the digital storage element 10. Data can be written to the digital storage element irrespective of the detection of a match which is used in the content addressing mode of the system for updating purposes. Both read and write operations can occur, as is the case for update, in one clock cycle.

In PSMU operation all 256 units are searched and multiple locations (units) are found that have a target data for matches which are detected, the units containing the target data will be updated with new data. All this occurs in one clock cycle. Either one or two input data buses may be used in the PSMU operation. In a preferred embodiment two buses are used. They are the DI and DC buses which are 8 bits wide in the illustrated MUCAM architecture. The PSMU operation may be better understood using C program constructs. In this program, MUCAM [x] is the content of the MUCAM unit at address x.

```
for (address = 0; address <= 255; address++) {
    if (MUCAM[address] == target_data) {
        MCAM[address] = new_data;
    }
{
```

For certain applications, the first and/or the last location may contain a special data which may not change with the PSMU operation. As an example, MUCAM can be used to store an equivalence table, where the nth location contains the equivalence of the label n. That is, the content j at the location i means that the label i is equivalent to the label j. In this particular example, label 255 could be used as a background label, and hence, the last location may never change its value. For this purpose, the update of the first and/or the last location is enabled or disabled by two external control signals, FCNT and LCNT. Therefore, the index range of the for loop in the PSMU operation can be adjusted as follows.

with the update enabled at the first and last locations, for (address=0; address ←=255; address++)
with the update disabled at the first location, for (address=1; address ←=255 address++)
with the update disabled at the last location, for (address=0; address ←=254; address++)
with the update disabled at the first and last locations, for (address=1; address ←=254; address++)

The second operation is a conventional write operation. In a preferred embodiment, there are two buses used for this operation, an address bus used exclusively by the write operation, and an input data bus.

The third operation is a conventional read operation. In a preferred embodiment, the read operation is independent of the write or the PSMU operations. Again, two buses are associated with this operation. One of them is an output data bus, the other a read address bus. With separate input and output data bus along with separate read and write address bus, units can be selectively written or read like a dual-port random access memory. Separate input and output data and address buses are not, however, required in any way for the multiple update operations.

Clash indications may be provided and used for potential data clashes. There can be two clash signals (not shown). One of them is used to indicate the read address and write address clash. This signal is asserted when the read address and the write address are identical. This means that the output data may not be correct because of the possible writing at the same location. The other is compare data and output data clash. This signal is asserted when the compare data and the output data are identical. If an output data is the same as the compare data, then the output data may be in transition due to a PSMU operation.

In a typical PSMU operation, at least one of the inputs WEN or WA of the NAND gate 26 is low, so that writing is disabled. When the content of the 8 bit digital storage element 10 is the same as the compared data, the output of the 8 bit comparator 12 will be high. This high output passes through the 1 bit digital storage element 24, since UEN is low at the beginning of the clock cycle. Thus the value of the bit stored in the digital storage element 24 which appears at its output Q will be the same as the EQ output of the comparator 12.

The output of the digital storage element 24 passes through the two input NAND gate 20; the output of which will be high due to the low level of UEN. The 8 bit digital storage element 10 is therefore disabled (inhibited). In the latter half of the enabled pulse cycle (at the beginning of PSUM operation) UEN goes high and the 8 bit latch 10 is then enabled. After the UEN pulse disappears, the output of the comparator 12 can change due to a change in its input. However, this new value will not be propagated to the enable line of the digital storage element 10, since it is blocked at the 1 bit digital storage element 24.

FIGS. 3, 4, and 5 illustrate the MUCAM using memory cells or having field effect transistors which may be embodied in an integrated circuit chip using CMOS technology. FIG. 3 shows a 1 bit static RAM (random access memory) cell having six transistors M1, M2, M3, M4, M5, and M6, and or a 1 bit comparator provided by transistors M9, M10, and M11 which compare the data stored in the RAM part of the cell or with the compare data, DC. Other transistors M7 and M8 provide an input path for new input data during PSMU operation. The UPDATE control logic is implemented by transistors M12, M13, M14, M15 and M16. The read and write operation utilizes a decoder output DEC (corresponding to RA and WA respectively in FIG. 1). The input data and compare data DI and DC as well as complimentary data DIB and DCB are used. With DEC high, the data that appears on DI and DIB are passed through M5 and M6, respectively, and stored in the RAM cell formed by M1 through M6. During the read cycle, DI and DIB lines are precharged. Then the DEC line goes high. The signal change at the lines DI and DIB is detected by a sense amplifier (not shown) and used as the output.

During PSMU operation, the signals at EP, EV and UPDATE are produced in timing relationship shown in FIG. 4. Because of precharging, PSMU operation is dynamic, as explained above in connection with FIG. 1, and during the time period P1, the transistor M12 is on and the MATCH line is precharged.

The compare operation starts with EP, EV and UPDATE low and the data appearing on the DC and DCB lines and on the precharged MATCH line. Then both EP and EV go high. With the transition of the EP and EV lines, M12 is turned off and M16 on.

If the stored data and compare data are different, one of the transistors, either M9 or M10 is on, and only a high signal value will be passed through the transistor which is on, regardless of the data stored in the RAM cell (M1-M6). In this case, the transistor M11 will be on and the charge stored on the MATCH line is discharged through M11 and M16. Then the MATCH line will be low and M14 will be off. In the next part of the cycle the UPDATE line goes high (shown as P5 in FIG. 4). With the change in the state of the UPDATE line, precharging of the MATCH and MU lines stop and M15 is turned on. Since M14 is off, there is no further change in state of MU. The equivalent of the 1 bit digital storage element described in connection with FIG. 1 therefore occurs so that the data stored in the digital storage element of M1-M6 remains intact. If the stored data and the compare data are the same, then one of the transistors (either M9 or M10) is on, and only a low signal value is passed through the transistor which is on, regardless of the data stored in the digital storage element of the RAM cell (M1-M6). In this case, M11 is off and the precharged MATCH line will stay high. During the time period P5, as shown in FIG. 4, both M14 and M15 are on, and the charge stored in the MU line is discharged. This will force M7 and M8 to turn on and new data is written into the digital storage element of the RAM cell (M1-M6).

FIG. 5 shows an n-bit MUCAM unit with common update control circuitry. The unit is indicated generally as having capability of storing n-bits (a dataword). It may be an eight-bit word as described in connection with FIGS. 1 and 2. During PSMU operation, the charge stored during the precharge cycle on the MATCH line will remain only if all the DC [0:n] lines are the same and represent the same data as stored in the cells for each bit. Then the MU line may go low and cause an update of the data in the cells. If any of the bits in the compare data and the stored data are different, the charge stored on the MATCH line is discharged and no further transitions occur on the MU line. Therefore, the entire stored word remains intact and unaltered.

From the foregoing description, it will be apparent that there has been provided an improved digital data memory unit and memory unit array which can be searched in accordance with the unit's output and updated with new data. Variations and modifications in the herein described memory unit and array, within the scope of the invention, will undoubtedly suggest themselves to those skilled in the art. Accordingly, the foregoing description should be taken as illustrative and not in a limiting sense.

We claim:

1. A content controlled updatable data memory unit, which is updatable during an update pulse cycle, and which comprises means for storing a first input dataword; and means for enabling said storing means to be updated to store a second input dataword which comprises means connected to said storing means for comparing said first word with a third word, and control means responsive to an update enable pulse which changes state during said cycle for enabling said storing means to be updated to store said second word when said first and third word match.

2. The memory unit according to claim 1 further comprising a plurality of units identical to said unit and dispose therewith in an array, and means for operating said enabling means of all of said units simultaneously, whereby updates in a multiplicity of said units can occur at the same time.

3. The memory unit array according to claim 2 further comprising means for addressing said units in said array for selectably enabling writing of first data words into said storing means of different ones of said units and for selectably reading the datawords stored in different ones of said units.

4. The memory unit according to claim 1 or the memory unit array according to claim 2 further comprising means included in said control means for inhibiting storing of data words in said unit or units except when said comparing means provides an output representing said match.

5. The unit according to claim 1 wherein said storage means of said unit is a digital storage element having an input for enabling the writing of said datawords therein which input is connected to said update enable pulse responsive means.

6. The memory unit array according to claim 2 wherein said storage means of the units of said array are digital storage elements and all of the units of said array have an input for enabling each digital storage element for writing of said datawords therein and connected to said update enable responsive means of the respective units.

7. The memory unit according to claim 1 or the memory unit array according to claim 2 wherein said comparing means is a comparator providing an output bit representing the presence or absence of a match, said control means comprises a digital storage element for storing said output bit, means for applying said enable pulse to enable said digital storage element to be set to the value of said output bit at the beginning of said update pulse cycle, and a gate responsive to the bits stored in said digital storage element and said update enable pulse for applying said update enable pulse to said storing means for enabling updating thereof, when said bit corresponds to the presence of said match and the occurrence of said enable pulse in said cycle after the beginning thereof.

8. The memory unit array according to claim 2 further comprising means for providing a match output signal when a match is detected in any of said units.

9. A memory unit containing a comparator and a digital storage element, which unit is accessed during each of a plurality of successive clock pulse periods by four signal lines, namely a data line, a comparand line, a write line and a match line, said unit comprising an update line and update control means responsive to signals from the write, update and match lines for providing an output which enables the contents of the digital storage element to be updated from said data line during any one of said clock periods upon occurrence therein of said signals from both said match line and said update line.

10. The memory unit according to claim 9 wherein said digital storage element includes a plurality of one bit memory elements, and said digital storage element stores a data word having a plurality of bits, each in a different memory element.

11. The unit according to claim 1 or 2 wherein said comparing means has an output, and means for precharging said output and discharging said output when said storing means is enabled.

* * * * *